(12) United States Patent
Lindström et al.

(10) Patent No.: US 10,026,561 B2
(45) Date of Patent: Jul. 17, 2018

(54) TRANSPARENT DYE-SENSITIZED SOLAR CELL AND A METHOD FOR MANUFACTURING THE SOLAR CELL

(71) Applicant: Exeger Operations AB, Stockholm (SE)

(72) Inventors: Henrik Lindström, Åkersberga (SE); Giovanni Fili, Stockholm (SE)

(73) Assignee: Exeger Operations AB, Stockholm (SE)

( * ) Notice: Subject to any disclaimer, the term of this patent is extended or adjusted under 35 U.S.C. 154(b) by 0 days.

(21) Appl. No.: 15/117,306

(22) PCT Filed: Jan. 13, 2015

(86) PCT No.: PCT/EP2015/050467
§ 371 (c)(1),
(2) Date: Aug. 8, 2016

(87) PCT Pub. No.: WO2015/117795
PCT Pub. Date: Aug. 13, 2015

(65) Prior Publication Data
US 2016/0351343 A1   Dec. 1, 2016

(30) Foreign Application Priority Data
Feb. 6, 2014 (SE) ....................... 1450123

(51) Int. Cl.
*H01G 9/20* (2006.01)
*H01L 51/00* (2006.01)

(52) U.S. Cl.
CPC ......... *H01G 9/2059* (2013.01); *H01G 9/2022* (2013.01); *H01G 9/2031* (2013.01);
(Continued)

(58) Field of Classification Search
CPC ....... H01G 9/20–9/2095; Y02E 10/542; Y02E 10/549; H01L 51/0023; Y02P 70/521
(Continued)

(56) References Cited

U.S. PATENT DOCUMENTS

2011/0030781 A1* 2/2011 Han ...................... H01B 1/122
136/256
2011/0315213 A1* 12/2011 Takada ................. H01G 9/2022
136/256
(Continued)

FOREIGN PATENT DOCUMENTS

EP  2 402 967 A2  1/2012
EP  2 634 777 A1  9/2013
(Continued)

OTHER PUBLICATIONS

Lewarchik, Ron. "Nanoparticles—When Smaller is Better." http://knowledge.ulprospector.com/2435/pcnanoparticleswhensmallerisbetter/ Published online May 8, 2015. Accessed Jan. 25, 2017.*
(Continued)

*Primary Examiner* — Liesl C Baumann
(74) *Attorney, Agent, or Firm* — Dilworth & Barrese, LLP (57) ABSTRACT

The present invention relates to a dye-sensitized solar cell (DSC) comprising a porous isolating substrate (30) having a first surface and a second surface, a first porous layer (14) comprising conducting particles printed on the first surface of the porous isolating substrate to form a conductive porous layer, a second porous layer (16) comprising conducting particles printed on the second surface of the porous isolating substrate to form a conductive porous layer, whereby the porous isolating substrate is disposed between the first and second porous layers, a third porous layer (18) comprising light absorbing dye molecules deposited on the first porous
(Continued)

layer, and a charge transfer medium for transferring charges between the third and first porous layers. Each of the porous layers comprise a printed pattern including at least one non-transparent portion (24, 25, 26) and at least one transparent portion (20, 21, 22) and the porous isolating substrate comprises at least one transparent portion (32), whereby said transparent portions of the porous layers and said transparent portion of the porous isolating substrate are positioned relative to each other so they form at least one continuous transparent pathway through the solar cell.

8 Claims, 3 Drawing Sheets (52) U.S. Cl.
CPC ........ *H01L 51/0023* (2013.01); *Y02E 10/542* (2013.01); *Y02E 10/549* (2013.01); *Y02P 70/521* (2015.11)

(58) Field of Classification Search
USPC .......................................................... 136/263
See application file for complete search history.

(56) References Cited

U.S. PATENT DOCUMENTS

| | | | | |
|---|---|---|---|---|
| 2012/0038079 | A1* | 2/2012 | Perrier | H01B 1/24 264/105 |
| 2012/0042930 | A1* | 2/2012 | Yamanaka | H01G 9/2022 136/244 |
| 2012/0055549 | A1* | 3/2012 | Kohno | H01G 9/2022 136/256 |
| 2013/0220412 | A1 | 8/2013 | Hatton et al. | |
| 2013/0237006 | A1 | 9/2013 | Yun et al. | |
| 2013/0255761 | A1 | 10/2013 | Mathieson et al. | |

FOREIGN PATENT DOCUMENTS

| | | |
|---|---|---|
| JP | 2004-221496 A | 8/2004 |
| SE | 1450123 A1 * | 8/2015 |
| WO | 2012/045881 A1 | 4/2012 |
| WO | 2013/053501 A1 | 4/2013 |
| WO | 2013/149787 A1 | 10/2013 |
| WO | 2013/149789 A2 | 10/2013 |
| WO | 2014/184379 A1 | 11/2014 |

OTHER PUBLICATIONS

Machine translation of JP 2004-221496. Obtained from AIPN online May 10, 2017.*

Yoon et al, "Application of transparent dye-sensitized solar cells to building integrated photovoltaic systems," Building and Environment vol. 46, No. 10, Mar. 23, 2011, pp. 1899-1904.

* cited by examiner

TRANSPARENT DYE-SENSITIZED SOLAR CELL AND A METHOD FOR MANUFACTURING THE SOLAR CELL

FIELD OF THE INVENTION

The present invention relates to a transparent dye-sensitized solar cell. The present invention also relates to a method for manufacturing transparent dye-sensitized solar cells.

PRIOR ART

Dye-sensitized solar cells (DSC) have been under development over the last 20 years and work on similar principles as photosynthesis. Unlike silicon solar cells, these cells obtain energy from sunlight using dyes, which can be manufactured at low cost, environmentally unobtrusive and in abundance.

A conventional sandwich type dye-sensitized solar cell has a few μm thick porous $TiO_2$ electrode layer deposited onto a transparent conducting substrate. The $TiO_2$ electrode comprises interconnected $TiO_2$ metal oxide particles with dye molecules adsorbed on the surface of the $TiO_2$ particles and forms a working electrode. A transparent conducting substrate is a transparent conducting oxide deposited onto a glass substrate. The transparent conducting oxide layer serves as an electron collector extracting photo-generated electrons from the working electrode. The $TiO_2$ electrode is in contact with an electrolyte and another transparent conducting substrate, i.e. a counter electrode.

Sunlight is harvested by the dye, producing photo-excited electrons that are injected into the conduction band of the $TiO_2$ particles and further collected by the conducting substrate. At the same time, $I^-$ ions in the redox electrolyte reduce the oxidized dye and transport the generated electron acceptors species to the counter electrode.

Normally, solar cells have a front contact, whereby the current collector is positioned on top of the light absorbing layer. The light has to pass through the front contact before it can hit the light absorbing layer. Consequently, the current collector needs to be both sufficiently transparent to the incoming light and have sufficiently high electronic conductivity to allow both the passage of maximum amount of light and conduct away the photogenerated electrical current without significant electrical resistive losses. Unfortunately, materials with high transparency have low conductivity and materials with high conductivity have low transparency. The transparent conductors used in front contact solar cells absorb part of the incoming light before it hits the light absorbing layer.

An advantage of DSC solar cell technology is that the current collector can be put on the back side of the light absorbing layer using the so-called "back contact" approach. A back contact allows for usage of extremely high conductivity current collectors that are not transparent to light, i.e. conductor that block light by reflecting light or absorbing light. The conductivity of the back contact current collector can be several orders of magnitude higher compared to the transparent current collectors used in the front contact. The light to electric energy conversion efficiency of the back contact DSC cell can be increased significantly, because of the reduced electrical losses, i.e. smaller resistance in the current collector, increased active area and higher photon flux hitting the light absorbing layer.

Figure 1:
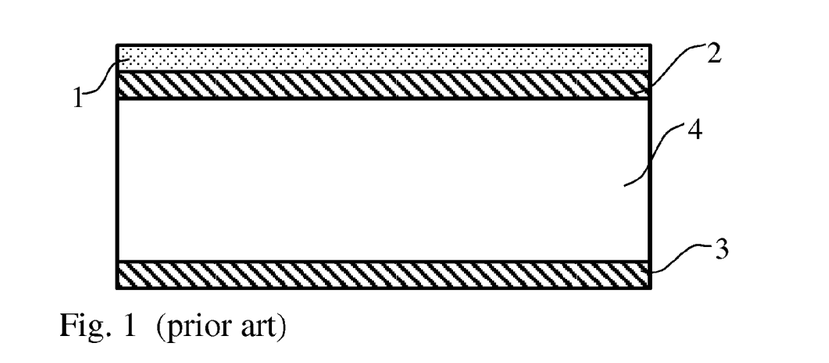
FIG. 1 shows schematically a dye-sensitized solar cell according to the prior art.

FIG. 1 shows an example of a dye-sensitized solar cell comprising a working electrode 1 including a porous metal oxide with light absorbing material deposited on a top side, a first conductive layer 2 for extracting photo-generated electrons from the working electrode, a porous isolating substrate 4 and a counter electrode including a second conductive layer 3 arranged on the opposite side of the porous isolating substrate. The first conductive layer 2 is a porous conductive layer deposited on one side of the porous isolating substrate 4. The second conductive layer 3 is a porous conductive layer deposited on the other side of the porous isolating substrate 4. The first and second conductive layers are printed on the porous isolating substrate. Both conductive layers 2, 3 consist of particles that are large enough not to penetrate the pores of the porous substrate. The substrate separates the conductive layers physically and electrically in order to avoid direct electronic short circuit between the conductive layers. Further, to allow the first and second conductive layers to be printed on the porous substrate, the porous substrate should be suitable for printing.

Pluralities of cells form together a solar cell module. The conductive layers may be sealed at the edges in order to protect the DSC modules against the surrounding atmosphere, and to prevent the evaporation or leakage of the DSC components inside the cell.

The electrode structure in FIG. 1 is infiltrated with an electrical charge transfer medium, such as an electrolyte, in the pores of the light absorbing layer and the porous electrodes and in the pores of the porous substrate. The charge transfer medium forms a continuous layer inside the conductors and between the conductors thereby enabling transport of electrical charge between the counter electrode and the working electrode. The first conductive layer is used to collect electrons generated by the light absorbing layer and to transport the electrons via an extern electrical circuit (not shown in FIG. 1) to the counter electrode. The counter electrode is used to transfer the electrons to the charge transfer medium. The charge transfer medium transfers electrons back to the light absorbing layer thereby completing the electrical circuit. Depending on the nature of the charge transfer medium, either ions or electrons and holes can be transported between the counter electrode and the light absorbing layer.

The charge transfer medium exhibits a certain electrical resistance to transport of charges. The electrical resistance increases with the charge transport distance. Therefore, when electrical charge is transported between the counter electrode and the light absorbing layer there will always be a certain electrical resistive loss in the charge transfer medium. By minimizing the distance between the counter electrode and the light absorbing layer it is possible to minimize the resistive loss. By making the porous substrate thinner the resistive losses can be reduced. However, when the porous substrate becomes thinner, it also becomes more mechanically fragile. Therefore, it is desirable to use a substrate that is thick enough for safe mechanical handling.

The back contact DSCs are not transparent due to the use of non-transparent highly conducting materials. Consequently, these back contact DSCs cannot be used for applications that require transparency such as building integrated photovoltaics (BIPV) or building applied photovoltaics (BAPV), where solar cells must both produce electricity and allow the passage of light to illuminate the inside of the building.

A known solution to making non-transparent solar cells transparent relates to the introduction of pores and holes in the solar cell unit by removing parts of the non-transparent cell material. Material can be removed using e.g. laser technology or etching. The drawback of this approach is that the solar cell material is removed and wasted at the position of the holes.

US 2013/255761 discloses a method for manufacturing a transparent working electrode, whereby the working electrode includes a porous metal foil. Pores are formed in the metal foil by needle penetration or laser ablation. Also mentioned is a method of sintering titan powder and pressing titan fiber paper to create holes in the solar cell.

Some of the known solutions increase the complexity of the solar cell. These solar cells are more fragile and more prone to failure. Such solar cells are also more difficult to manufacture. Often, additional material and process steps are needed using thin and delicate material.

There is a need for a solar cell, which is transparent, and has a good or increased light to electric energy conversion efficiency and high conductivity. There is a need for a solar cell that can be applied to or integrated in glass partitions of a structure, such as a building or a vehicle. There is also a need for a solar cell that can be manufactured at low cost. Suitably, no additional material or method steps should be needed for manufacturing the transparent solar cells. There is a need for a solar cell that can be manufactured without removing material from the solar cell, or without necessarily having to use laser or etching techniques and the like.

OBJECT AND SUMMARY OF THE INVENTION

The object of the present invention is to at least partially overcome the above mentioned drawbacks.

This object is achieved by a dye-sensitized solar cell (DSC) according to the description herein.

The DSC comprises a porous isolating substrate, which has a first and a second surface. A first porous layer comprising conductive particles is printed on the first surface of the substrate to form a first conductive layer. A second porous layer, comprising conductive particles, is printed on the second surface of the substrate to form a second conductive layer. The porous isolating substrate is thus positioned between the first and second porous layers. A third porous layer, the working electrode, is printed on the first porous layer. This third porous layer is provided with light absorbing dye molecules. The DSC comprises further a charge transfer medium for the transfer of charges between the second porous layer (the counter electrode) and the third porous layer (the light absorbing layer). Preferably, the charge transfer medium is transparent. This charge transfer medium may be positioned in the pores of the porous layers and the porous isolating substrate. All porous layers comprise a printed pattern, whereby each porous layer has at least one non-transparent portion and at least one transparent portion. The transparent portions of the porous layers and the transparent portion of the porous isolating substrate are positioned relative to each other so they form at least one continuous transparent pathway through the solar cell to allow light to penetrate through the solar cell in a direction perpendicular to the first and second surfaces.

The non-transparent portions are non-transparent due to the fact that they include non-transparent material/particles. The non-transparent portions of the first and second porous layers include conducting particles, for example metal particles, which are non-transparent. The non-transparent portions of the third porous layer include light absorbing dye molecules, which are non-transparent. However, due to the degree of non-transparent particles in the non-transparent portion, the degree of non-transparency may vary. With the term "non-transparent portion" is meant that at least 80% of incident light is prevented from penetrating through the portion.

The transparent portions are transparent due to the fact that they do not include non-transparent material/particles or include only a few non-transparent particles. With the term "transparent portion" is meant that it allows light transmission. However, there may be different degrees of transparency. For example, the transparent portions may be translucent colored, such as translucent yellow, or opalescent. Preferably, the transparent portion should allow more than 50% light transmission, and preferably more than 70% light transmission.

The non-transparent portions of the first and second porous layers are electrically conducting portions of the DSC. The transparent portions of the first, second and third porous layers and the substrate are non-conducting portions of the DSC. The porous isolating substrate also comprises at least one transparent portion. The entire porous isolating substrate can be transparent, or the substrate may not be transparent but including one or more transparent portions, for example through holes.

The transparent portions of the first, second and third porous layer and of the substrate are positioned so they form a continuous transparent pathway through the DSC, which allows light to pass through the DSC. Accordingly the DSC becomes transparent. Preferably, each of the porous layers comprises a plurality of transparent portions, which together with one or more transparent portions of the substrate form a plurality of transparent pathway through the DSC.

The transparent portions, for example, in the form of holes or dots, allow light to pass through the DSC. The transparent portion(s) of the first and second porous layers can be positioned anywhere between the non-transparent portion(s) as long as the non-transparent portion(s) of the layers form a continuous conducting pathway. This allows for the creation of a large number of different printed patterns for a DSC, for example as shown in FIGS. 4a-4d.

When the transparent portions of all layers and the substrate are aligned or on top of each other in a direction perpendicular to the first and second surface, the transparent portions form one or more pathways within the DSC allowing light transmission through the DSC. However, light can be reflected within the structure and thereby pass through the structure without the transparent portions overlap each other.

By providing porous layers with printed patterns including non-transparent portion and transparent portions it is possible to achieve a transparent back contact DSC including non-transparent highly conductive material. Each porous layer is printed as a pattern containing one or more portions, for example in the form of dots, where no conductive material is printed, such that light can penetrate through the transparent portions to achieve partial transparency of the DSC. The transparency level of the back contact DSC can then be adjusted by printing transparent portions of varying sizes, varying shapes and varying spacing. Additionally, advanced graphical patterns can be produced by varying the size, shape and spacing of the transparent portions. Basic imaging techniques, such as the halftone technique, can for example be used to design suitable print patterns resulting in desired graphical patterns. Consequently, by printing porous layers including transparent portions, it is possible to manufacture a back contact DSC that is both transparent and has graphical design.

The present invention makes it possible to manufacture transparent back contact DSCs for applications requiring transparency, such as in buildings, where solar cells must both produce electricity and allow the passage of light to illuminate the inside of the building.

A further advantage with using porous layers of printed patterns is that no solar material has to be removed or wasted in an extra needed process step (and no extra process step is needed). Consequently, by directly printing the back contact in the desired pattern it is possible to reduce the number of process steps and save solar cell material. Transparent conductors used in front contact solar cells have poor electrical conductivity and suffer therefore a greater loss in conductivity when provided with transparent portions, and this fact limits the number of possible useful patterns, and it limits the maximum size of such cells. In contrast, with the highly conducting DSC back contact approach it is possible to achieve a larger number of useful patterns without compromising the cell size. It is also possible to add different colors to the dots by coloring the front sheet or back sheet of the solar cell, thereby enhancing aesthetical quality.

The DSC can also be manufactured at low cost using relative uncomplicated printing techniques. No holes need to be made in the DSC, i.e. no laser or etching techniques need to be applied to obtain the transparent portions in the DSC. Thus, no additional materials or manufacturing steps are needed to make the DSC according to the description herein.

The present invention makes it possible to produce a back contact DSC having high electric conductivity, and thus allows for increased light to electric energy conversion efficiency, while at the same time being partially transparent.

The DSC is made of thin layers, which together form a thin DSC. The DSC can be easily installed in a glass partition of a structure, such as a building or vehicle. The pattern, i.e. the number and size of the transparent portions, can be adjusted to the circumstances. For example, in countries having a warm climate, the number and/or size of transparent portions can be limited to prevent sun from entering into the structure, while in countries with less sunlight, the number and/or size of the transparent portions can be increased to allow a maximum amount of light to enter the structure. Thus, the share of the area of the transparent portion(s) in the total area of the porous layers may vary depending on the application of the solar cell. Preferably, the area of the at least one transparent portion of each porous layer is between 10% and 70% of a total area of each porous layer, and typically the area of the at least one transparent portion of each porous layer is between 30% and 60% of a total area of each porous layer. Preferably, the area of the transparent portion(s) is similar in each porous layer.

In an embodiment, the at least one transparent portion of the porous layers are arranged to at least partly overlap each other to ensure that light is allowed to penetrate through the porous layers.

In a further embodiment, the printed pattern of the third porous layer corresponds to the printed pattern of the first porous layer. In one embodiment, the printed pattern of the second porous layer corresponds to the printed pattern of the first and third porous layers. It is convenient to use the same pattern for all three porous layers. Further, the production of DSCs providing a graphical pattern when light is penetrated through the DSC is facilitated.

The wording "corresponding pattern" when used in this specification is taken to specify "patterns having the same shape and the same orientation".

According to an embodiment of the invention, the solar cell comprises a plurality of connection elements, for example busbars, electrically connected to the first and second porous layers for connecting the first and second porous layers to an external electric circuit, and the printed patterns of the first and second porous layers are designed so that the non-transparent portions are in direct electric contact with at least one of the connection elements. This embodiment ensures that the current generated by the light is transported to the external circuit, and accordingly ensures high efficiency of the electrical power production of the DSC.

The third porous layer is a light absorbing layer, and its primary function is to absorb light and convert the light into electrical energy. The first and second porous layers are conductive layers. The primary function of the first porous layer is to collect current from the third porous layer and to transport the collected current to an external electric circuit. The primary function of the second porous layer is to receive the current from the external electric circuit and to transport the current to the charge transfer medium. In order to efficiently collect and transport current to the external electric circuit, all of the non-transparent portions of the first porous layer should be electrically connected to the connection element(s) of the first porous layer, to provide one or more continuous electrically conducting paths between the non-transparent portions of the first porous layer and the external electric circuit. In order to efficiently transfer the current from the external electric circuit to the charge transfer medium, all of the non-transparent portions of the second porous layer should be electrically connected to the connection element(s) of the second porous layer, thereby providing one or more continuous electrically conducting paths between the non-transparent portions of the second porous layer and the external electric circuit.

In one embodiment, the printed pattern includes a plurality of transparent portions distributed in one non-transparent portion. The transparent portions are, for example, transparent dots distributed in a non-transparent portion. The non-transparent portion forms a continuous conducting layer for transportation of current to and from the external electrical circuit. The transparent portions may be arranged to form a graphical pattern together with the non-transparent portion.

Preferably, the first and second layers are porous conductive powder layers. This means that the layers were produced by depositing conductive particles in solid form. The solid particles are metal based and can be pure metals, metal alloys or metal hydrides or hydrides of metal alloys or mixtures thereof. The porosity of the porous conductive powder layers can be between 15% and 85%. A porosity between 30% and 70%, or between 40% and 60%, is preferred.

The transparent portion(s) of the porous isolating substrate can be achieved in different ways. Either, the entire substrate is transparent or only parts of the substrate are transparent.

In one embodiment, the charge transfer medium has a first refraction index and the porous isolating substrate comprises material having a second refraction index, whereby the difference between the first and second refraction index is less than 0.2. By having a charge transfer medium having a refraction index that is similar to the refraction index of the substrate, the substrate becomes transparent, or at least semitransparent. The smaller the difference in refraction between the charge transfer medium and the substrate, the higher the transparency of the substrate becomes. Thus, the difference between the refraction index of the charge transfer medium and the refraction index of the substrate should be as small as possible in order to achieve as high transparency as possible of the substrate.

In another embodiment, the porous isolating substrate comprises a translucent material, for example glass fibers or quartz fibers.

In another embodiment, the porous isolating substrate comprises one or more transparent portions of a transparent plastic material.

In a further embodiment, said at least one transparent portion of the porous isolating substrate is a through hole extending between the first and second surface of the porous isolating substrate.

The invention also relates to a use of the dye-sensitized solar cell, as defined above, in a glass partition of a structure.

This object is also achieved by a method for manufacturing a transparent dye-sensitized solar cell, as defined herein.

The method comprises printing a first porous layer comprising conducting particles on a first surface of an porous isolating substrate comprising at least one transparent portion, printing a second porous layer comprising conducting particles on a second surface of the porous isolating substrate, printing a third porous layer on top of the first porous layer, and dying the third porous layer with light absorbing molecules, and each of the first, second and third porous layers are printed in pattern including at least one non-transparent portion and at least one transparent portion, and the patterns are printed such that said transparent portions of the porous layers and said transparent portion of the porous isolating substrate form at least one continuous transparent pathway through the solar cell, to allow light to penetrate through the solar cell.

An advantage with this method is that no solar material has to be removed or wasted and no extra process step is needed. Consequently, by directly printing the porous layers in the desired pattern it is possible to reduce the number of process steps and save solar cell material.

In one embodiment, the patterns are printed such that said transparent portions of the porous layers and said transparent portion of the porous isolating substrate at least partly overlap each other in a direction transvers the first and second surface.

In one embodiment, the at least one non-transparent portion of the third porous layer is printed on top of the at least one non-transparent portion of the first porous layer. This means that the non-transparent portion(s) of the third porous layer is equal in size or smaller than the non-transparent portion(s) of the first porous layer.

In one embodiment, the patterns of the first, second and third porous layers correspond to each other, i.e. the shape and size of the transparent and non-transparent portions of porous layers are equal. This embodiment facilitates the production of the DSC.

In one embodiment, the printed pattern is printed using screen printing. Screen printing is a useful method to print the pattern. However, it is also possible to use other printing methods.

In one embodiment, the method comprises punching the porous insolating substrate to provide at least one through-hole extending between the first and second surface of the porous isolating substrate. The substrate is provided with one or more through holes before printing the layers. The through hole(s) form transparent portions extending through the substrate. This method is a simple way to provide transparent portions of the substrate.

In one embodiment of the method, the first and second porous layers are formed by printing a deposit comprising conductive particles onto the substrate, and sintering the conductive particles for forming conducting layers.

In one embodiment of the method, a porous conductive powder layer is formed on one side of the porous isolating substrate and a second porous conductive powder layer is formed on the other side of the porous isolating substrate.

In another embodiment of the method, the deposit comprises a catalyst for forming a second porous conductive powder layer.

In a further embodiment of the method the third porous layer comprises $TiO_2$ and the first and the second porous layer comprise titanium particles.

In a further embodiment the titanium particles are formed by heat decomposition of printed titanium hydride particles.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 2:
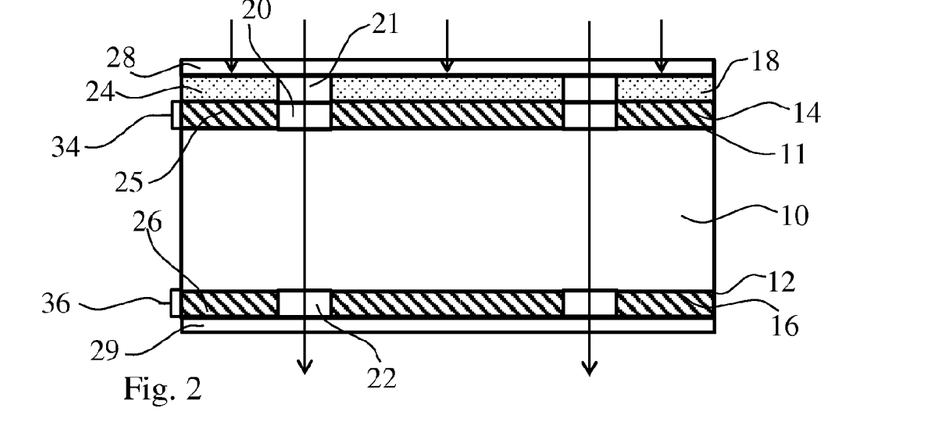
FIG. 2 shows schematically a cross-section of a dye-sensitized solar cell according to an embodiment of the invention.

FIG. 2 shows an example of a dye-sensitized solar cell (DSC) according to a first embodiment of the invention. The DSC comprises a porous isolating substrate 10 having a first surface 11 and a second surface 12. In this embodiment, the porous isolating substrate 10 is transparent or becomes transparent when it is emerged in a charge transfer medium. For example, the substrate is made of a translucent material such as glass fibers or quartz fibers. The DSC further includes a first porous layer 14 comprising conducting particles printed on the first surface 11 of the porous isolating substrate to form a first conductive layer, and a second porous layer 16 comprising conducting particles printed on the second surface 12 of the porous isolating substrate to form a second conductive layer. In the following the first porous layer is called the first conductive layer and the second porous layer is called the second conductive layer. The porous isolating substrate 10 is disposed between the first and second conductive layers 14, 16.

A third layer 18 including metal oxide particles and light absorbing dye molecules is deposited on the first conductive layer 14. In the following the third layer is called the light absorbing layer. The light absorbing layer 18 is printed on top of the first layer. The metal oxide particles are then dyed with light absorbing dye molecules. The light absorbing layer 18 forms a working electrode. The first conductive layer 14 is adapted to extract photo-generated electrons from the light absorbing layer. Preferably, the first, second and third layers are porous layers. The DSC further includes a transparent charge transfer medium for transferring charges between the layers. The charge transfer medium, such as an electrolyte, is infiltrated in the pores of the light absorbing layer, the conductive layers and the substrate. The charge transfer medium forms a continuous medium between the layers, thereby enabling transport of electrical charge between the light absorbing layer and the second conductive layer. The charge transfer medium is comprised in the pores of the layers and substrate in order to transfer charges from the light absorbing layer to the second conductive layer. The charge transfer medium is, for example, a liquid electrolyte. To improve the transparency of the substrate, the charge transfer medium can be selected having a refraction index close to the refraction index of the porous isolating substrate. Preferably, the difference between the refraction indexes is less than 0.2. By having a charge transfer medium in the form of an electrolyte having a refraction index which is similar to the refraction index of the substrate, the substrate becomes transparent, or at least semitransparent.

The first conductive layer 14 is used to collect electrons generated by the light absorbing layer 18 and also to transport the electrons via an external electrical circuit (not shown) to the second conductive layer 16. The second conductive layer 16 is used to transfer the electrons to the charge transfer medium. The charge transfer medium transfers the electrons back to the light absorbing layer thereby completing the electrical circuit.

Each of the layers 14, 16, 18 comprise a printed pattern including at least one transparent portion 20, 21, 22 and at least one non-transparent portion 24, 25, 26. In this embodiment, each of the layers includes a plurality of transparent portions. The transparent portions of the layers are positioned relative to each other so they form continuous transparent pathways through the solar cell in a direction perpendicular to the first and second surface of the substrate. Suitably, the printed pattern is identical in the three layers 14, 16, 18. Suitably, the printed patterns haves the same position and orientation in the different layers so that corresponding transparent portions of the layers are aligned. However, it is possible to have different patterns as long as the transparent portions of the layers at least partly overlap each other. The non-transparent portions of the first and second conductive layers are electrically conducting, and are arranged to form one or more conducting paths in a direction parallel to the first and second surfaces of the substrate in each of the first and second conductive layer. Preferably, the non-transparent portions of first and second conductive layers form at least one continuous current path in each layer.

The solar cell comprises at least one connection element 34 electrically connected to the first conductive layer for connecting the first conductive layer to an external electric circuit (not shown), and at least one connection elements 36 electrically connected to the second conductive layer for connecting the second conductive layer to the external electric circuit. For example, the connection elements 34, 36 are busbars. In one embodiment, the solar cell includes two connection elements connected to the first conductive layer and disposed on opposite sides of the first conductive layer, and two connection elements connected to the second conductive layer and disposed on opposite sides of the second conductive layer. The connection elements may extend along the entire side of the layers. Preferably, the printed patterns of the first conductive layer is designed so that the non-transparent portions 25 are in direct electric contact with the connection element 34, and the printed patterns of the second conductive layer is designed so that the non-transparent portions 26 of are in direct electric contact with the connection element 36.

In order to efficiently conduct away current from the light absorbing layer, the non-transparent portions of the first conductive layer should provide a direct electrically conducting path from the light absorbing layer to the connection elements. Further, in order to efficiently transfer current from the external electric circuit to the charge transfer medium, the non-transparent portions of the second conductive layer should provide a direct electrically conducting path to the connection elements. Consequently the first and second conductive layers should be printed in such a way that "islanding" of the non-transparent portions is avoided. Therefore the first and second conductive layers should preferably be a continuous conductive layer disrupted by transparent portions, where the positioning of the transparent portions does not cause islanding or isolation of non-transparent portions. Furthermore, the printed pattern should be designed taking into account the conductivity of the back contact layer, the distance the current must travel, and the electrical current produced by the light absorbing layer such that electrical losses is minimized in order to achieve maximum electrical power.

The DSC also includes a first sheet 28 covering a top side of the DSC and a second sheet 29 covering a bottom side of the DSC and acting as liquid barriers for the electrolyte. The first and second sheets 28,29 needs to be transparent, allowing light to pass through. The sheets 28, 29 are, for example, made of a transparent polymer material.

Figure 3:
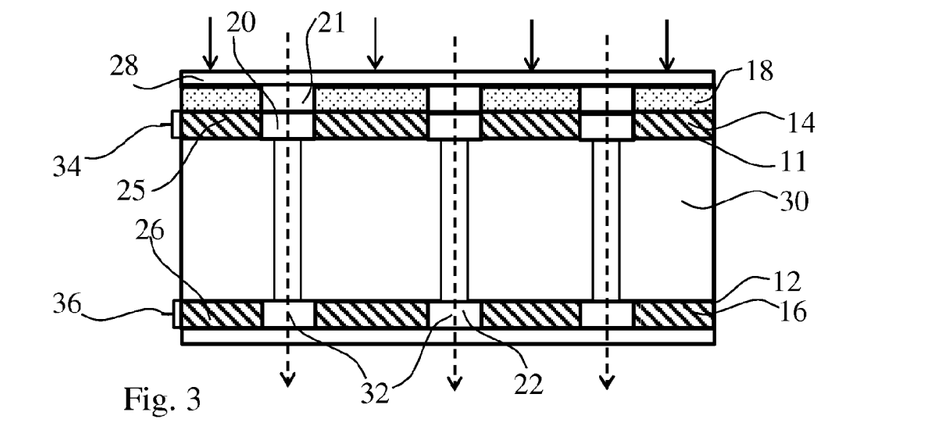
FIG. 3 shows schematically a cross-section of a dye-sensitized solar cell according to another embodiment of the invention.

FIG. 3 shows an example of a dye-sensitized solar cell according to a second embodiment of the invention. Like or corresponding parts in the FIGS. 2 and 3 are indicated with like numerals. The embodiment shown in FIG. 3 differs from the embodiment shown in FIG. 2 in that it includes a porous isolating substrate 30 made of a non-transparent material. To allow light to pass through the substrate 30, the substrate is provided with at least one transparent portion 32 extending between the first and second surface of the substrate. The transparent portions 32 are, for example, through-holes or portions of a transparent plastic material extending between the first and second surface. The transparent portions 32 of the substrate are positioned relative the transparent portions 20,21,22 of the layers such that they form a continuous pathway through the DSC for the light. Preferably the transparent portions 32 of the substrate and the transparent portions 20,21,22 of the layers are aligned, as shown in FIG. 3.

FIGS. 4a-d shows examples of different suitable designs for the printed pattern. The transparent portions are white and the non-transparent portions are black in the figures. The DSC may be printed in a pattern of a logo or brand name. Also, one or more colours may be used in the DSC. Thus, the DSC can be used for commercial purposes in combination with harvesting energy from sun light. Preferably, the printed pattern is designed so that the non-transparent portion(s) extend from one end of the layer to the other end of the layer to form at least one continuous conducting path from one end of the layer to the other end of the layer. This is particularly important for the first and second conductive layers, which main function is to conduct current. Neither should the positioning of the transparent portions cause "islanding" or isolation of the non-transparent portions.

Figure 4A:
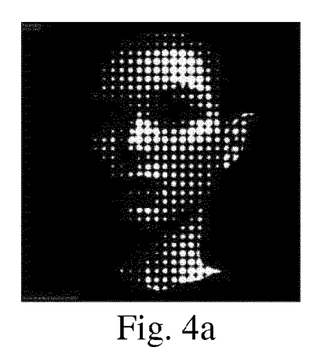
FIGS. 4a-d show examples of suitable designs for the printed pattern of the porous layers of a dye-sensitized solar cell according to the invention.

FIG. 4a shows an example of a printed pattern including one non-transparent portion and a plurality of transparent portions distributed in the non-transparent portion. The transparent portions are shaped as dots.

Figure 4B:
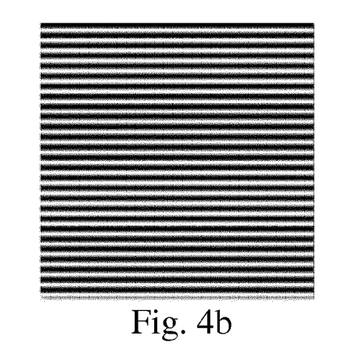

In another embodiment, the printed pattern includes a plurality of non-transparent portions and plurality of transparent portions distributed between the non-transparent portions. FIG. 4b shows a pattern including a plurality of non-transparent portions in the form of strips extending from one end of the pattern to the other end of the pattern thereby forming a plurality of electrically conducting paths, and a plurality of transparent portions extending between the non-transparent portions.

Figure 4C:
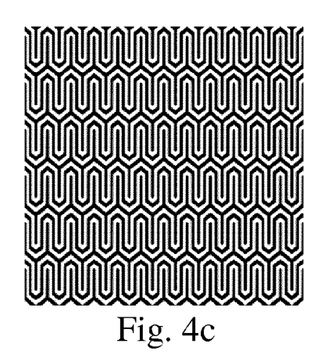
Figure 4D:
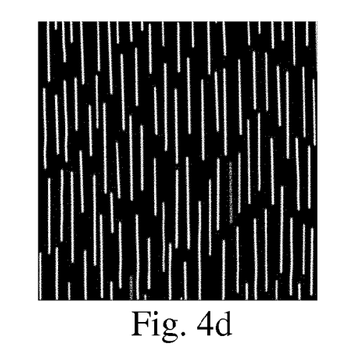

FIGS. 4c and 4d show other types of patterns having in common that the non-transparent portions form at least one continuous conducting path from one side of the pattern to the opposite side of the pattern.

Figure 5A:
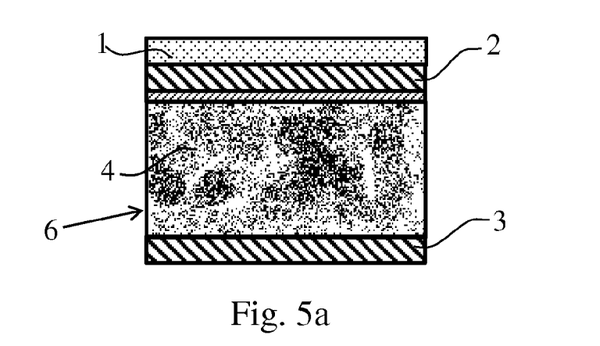
FIGS. 5a-b show examples of embodiments for a DSC that could suitably be used.
Figure 5B:
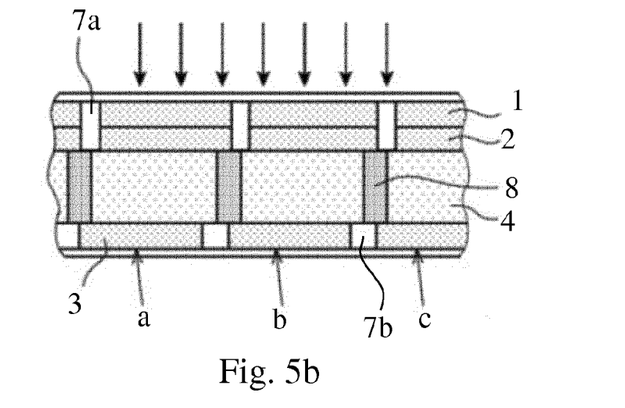

FIGS. 5a-b show examples of other embodiments of the DSC. Different types of dye-sensitized solar cells (DSCs), whereby the different layers of the cell can be printed on top of each other, can be used to manufacture the DSC defined in claim 1. The present invention is not limited to a specific embodiment of a DSC.

Another type of DSC is shown in FIG. 5a. The DSC differs from the embodiments of FIGS. 2 and 3 in that the solar cell includes a porous isolating layer 5 disposed between the first and second conductive layers 2,3 and a conductive layer 6 disposed between the porous isolating layer 5 and the second conductive layer 3. The conductive layer 6 includes a porous substrate 4 made of an isolating material and conducting particles forming a conducting network through the isolating material. The additional isolating layer 5 is printed on the first surface of the substrate 4. The first conductive layer 2 is printed on the additional isolating layer 5 and a second conductive layer 3 is printed on the second surface of the substrate 4. A working electrode 1 is printed on the first conductive layer 2. A charge transfer medium is comprised in the layers and substrate in order to transfer charges between second conductive layer 3 and the working electrode 1. Further details about this embodiment are disclosed in SE 1350611-8, which is hereby incorporated by reference. In order to achieve a transparent DCS, the working electrode 1 and the conductive layers 2,3, are printed in a pattern including transparent and non-transparent portions in the same way as described with reference to FIGS. 2 and 3. Further, the conductive layer 6 including the substrate 4 can be provided with transparent portions in the form of through holes extending through the layer 6. The isolating layer 5 can be printed with the same pattern as the first and second conductive layers, or be provided with through holes in the same way as the conductive layer 6.

FIG. 5b shows an embodiment of a DSC comprising a plurality of dye-sensitized solar cell units arranged adjacent to each other and connected in series. The DCS comprises a working electrode 1, a first conductive layer 2 for extracting photo-generated electrons from the working electrode, a counter electrode including a second conductive layer 3, and electrolyte for transferring electrons from the counter electrode to the working electrode. The DSC further comprises a series connecting element 8 for electrically connecting the counter electrode to a working electrode of an adjacent cell unit. The DCS comprises a porous insulating substrate 4 having the first conductive layer 2 printed on the first surface of the substrate 4 and the second conductive layer 3 printed on the second surface. The working electrode 1 is printed on the first conductive layer.

The series connecting element 8 is a conductive layer penetrating through the porous insulation substrate 4 and extending between the first conductive layer 2 of one of the cell units and the second conductive layer 3 of the adjacent cell unit, thereby electrically connecting the first conductive layer of one of the cell units with the second conductive layer of the adjacent cell unit. Spaces 7a and 7b, between cell units a, b, c, are also shown. Further details about this embodiment are disclosed in WO 2013/149787, which is hereby incorporated by reference. In order to achieve a transparent DCS, the substrate 4 can be provided with through holes positioned between the series connecting elements 8. The working electrode 1 and the conductive layers 2,3, are printed in patterns including transparent and non-transparent portions in the same way as described with reference to FIGS. 2 and 3. However, the printed pattern of the first and second conductive layers should include non-transparent portions at least partly overlapping the series connecting elements 8 to electrically connect the conductive layer with the series connecting elements 8. Further, the spaces 7a-7b are transparent portions of the layers.

In one embodiment, the porous isolating substrate 4 comprises a woven fabric and non-woven fabric. Further details about this embodiment are disclosed in WO 2013/149789, which is hereby incorporated by reference. Examples of other DSCs that can suitably be used in the present invention are for example disclosed in WO2012/045881, which is hereby incorporated by reference.

The porous isolating substrate can be made of a material that is suitable for printing. The substrate can be made of paper, such as paper made of micro fibres that may be a woven fabric and/or a non-woven fabric. Preferably, the porous isolating substrate is a ceramic microfiber-based substrate, such as a glass microfiber or a ceramic microfiber substrate. Glass fibers, aluminosilicate fibers or quartz fibres may be used. The porosity of the porous isolating substrate will enable ionic transport through the substrate. The substrate comprises at least one transparent portion. The substrate may comprise a plurality of transparent portions. The transparent portion may be a through hole extending between the first and second surface, where the material of the substrate 4 has been removed. This through hole may filled with electrolyte or a transparent material, such as a plastic.

The non-transparent portions of the light absorbing layer 18 include metal oxide particles, for example $TiO_2$ particles, dyed with light adsorbing dye molecules. The non-transparent portions of the conductive layers 14,16 comprise conductive metal particles. The material forming the first and second conductive layer 2, 3 is suitably porous. The first and second conductive layers 14,16 can for example be made of a material selected from a group comprising titanium, titanium alloys, nickel, nickel containing alloys, chromium containing alloys, graphite, and amorphous carbon, or mixtures thereof. Suitably, the first and second conductive layers are made of titanium or a titanium alloy, or mixtures thereof.

Depending on the nature of the charge transfer medium, either ions or electrons and holes can be transported between the second conductive layer and the light absorbing layer. Examples of electrolytes are liquid electrolytes (such as those based on the I-/I3-, redox couple or cobalt complexes as redox couple), gel electrolytes, dry polymer electrolytes and solid ceramic electrolytes. When electrolytes are used as charge transfer medium, the counter electrode is normally equipped with a catalytic substance that serves the purpose of facilitating the transfer of electrons to the electrolyte. Semiconductors can be used as charge transfer medium to transport electrons and holes between the second conducting layer and the light absorbing layer. Examples of semiconductors are inorganic semiconductors, such as CSCN or CuI, and organic semiconductors, such as Spiro-OMeTAD. When semiconductors are used as charge transfer medium the counter electrode is normally equipped with a substance that serves the purpose of creating a good electrical contact, i.e., a good ohmic contact, between the counter electrode and the charge transfer medium.

The DSC according to the invention can suitably be used to provide energy to structures, such as buildings or vehicles. The DSC can be positioned in or on any partition of the structure. A partition can be any area of the structure, such as a wall or an opening between the walls in which a window can be positioned. The DSC is especially suitable for use in an area of the structure where light enters the structure, such as a glass partition of a building. Other examples may be glass partitions in a vehicle, such as a car or a bus.

The area of the transparent portion(s) of the printed pattern can be between 10% and 80% of the total area of the layer. The amount of light that passes through the transparent DSC can be varied by varying the area of transparency of the total area of the DSC. This allows for great flexibility in the use of the DSC. For example, in a warm climate, it may be desired to reduce the amount of sunlight passing through a window, while at the same time energy is needed for air conditioning. In this case, a DSC can be designed having a printed pattern with only a few transparent portions and/or transparent portions of a small size. In a colder climate on the other hand, it may be desired to let as much sunlight enter the building as possible. For this situation a DSC can be designed having a printed pattern with a large amount of transparent portions and/or transparent portions of a large size.

Method

The DSC according to the invention can be manufactured in various ways. WO2013/053501 describes screen printing techniques that can be used for the manufacturing of the DSC according to the present invention. WO2013/053501, especially page 4 to 7, is hereby incorporated by reference. Examples of printing techniques are slot die coating, gravure, screen printing, knife coating, blade coating, doctor blading, flexo printing, dip coating or spraying. The term printing also covers dry powder deposition. The dry powder deposition can be made by, for example, sieving or electrostatic powder deposition.

Screen printing is a printing technique that uses a woven mesh to support an ink-blocking stencil to receive a desired image. The attached stencil forms open areas of mesh that transfer ink or other printable materials which can be pressed through the mesh as a sharp-edged image onto a substrate. A fill blade or squeegee is moved across the screen stencil, forcing or pumping ink into the mesh openings for transfer by capillary action during the squeegee stroke. Basically, it is the process of using a stencil to apply ink onto a substrate. Screen printing is also a stencil method of print making, in which a design is imposed on a screen of polyester or other fine mesh, with blank areas coated with an impermeable substance. Ink is forced into the mesh openings by the fill blade or squeegee, and onto the printing surface during the squeegee stroke. Screen printing is also known as silkscreen, serigraphy, and serigraph printing.

The method comprises printing a first layer on a first surface of an porous isolating substrate using ink comprising conductive particles, printing a second layer on a second surface of the porous isolating substrate using ink comprising conductive particles, and printing a third layer on top of the first layer using ink comprising metal oxide particles, dying the metal oxide with light absorbing molecules. Each of the layers are printed in pattern including at least one non-transparent portion and at least one transparent portion, and the patterns are printed such that the transparent portions of the first, second and third layers at least partly overlap each other.

Figure 6:
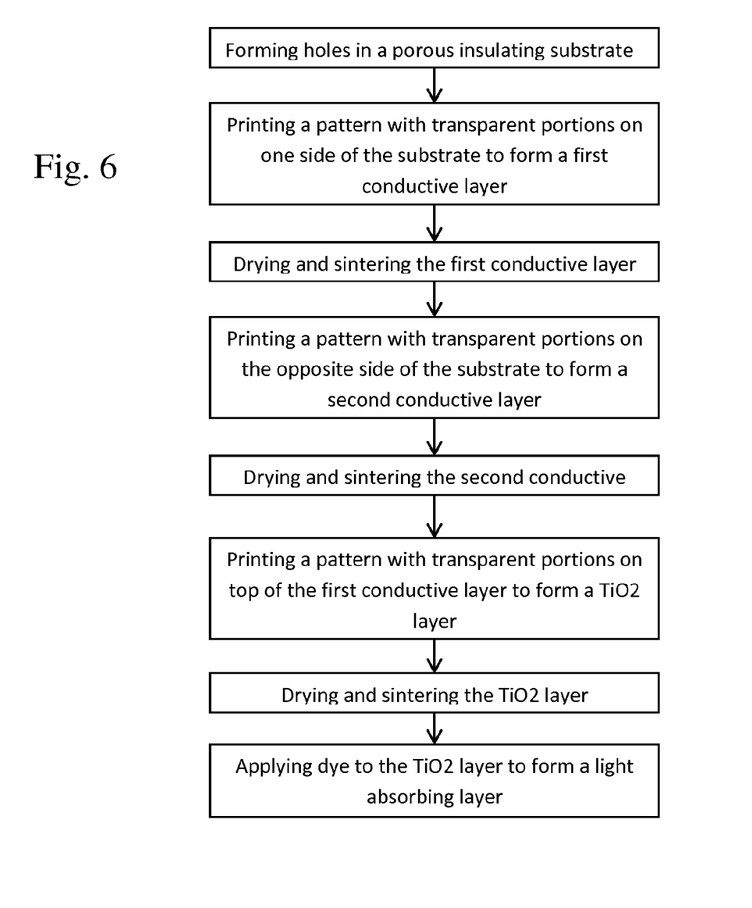
FIG. 6 illustrates an example of a method for manufacturing a dye-sensitized solar cell according to the invention.

One example of the method is described below with reference to FIG. 6.

In a first step one or more holes are formed into a porous isolating substrate, for example a glass microfiber substrate.

In a second step a first conductive powder layer is produced by printing a pattern including transparent portions on one side of the substrate by screen printing and using an ink including conductive particles. The ink may be prepared from a mixture of $TiH_2$ with an organic solvent, such as terpineol. The printed pattern corresponds with the non-transparent portions of the substrate.

In a third step the deposited ink is dried.

In a fourth step, the substrate with the deposited conductive particles is vacuum sintered to obtain a first porous conductive powder layer.

In a next step a second conductive powder layer is produced by printing a pattern including transparent portions on the other side of the substrate by screen printing using an ink including conductive particles. The printed pattern of the second conductive powder layer corresponds with the printed pattern of the first conductive powder layer so that the transparent portions of the first and second layer are aligned. The deposited ink is dried and the deposited conductive particles are vacuum sintered to obtain a second porous conductive powder layer.

In a next step, a $TiO_2$ based ink is deposited onto the first porous conductive powder layer using the same printing pattern and preparation steps as described above for the first porous conductive powder layer. The printed pattern corresponds with the printed pattern of the first and second conductive powder layer so that the transparent portions of the $TiO_2$ layer and first and second conductive powder layers are aligned. Optionally, two to three layers of $TiO_2$ based ink are printed in the same pattern onto the first layer of $TiO_2$ based ink prior to sintering this layer.

In a further step, dye molecules are applied to the $TiO_2$ layer to form a porous light absorbing layer.

The obtained DSC may then be filled with electrolyte and sealed.

Alternatively, the structure including a porous isolating substrate, a first porous conductive powder layer and dye-sensitized $TiO_2$ layer can then be sandwiched together with a second structure produced according to steps one to four, and having the same printing pattern.

In yet an alternative method the holes in the substrate are formed after the drying step, or after the sintering step.

EXAMPLES

Example 1—Porous Conductive Powder Layer on a Ceramic Substrate

An ink was prepared by mixing $TiH_2$ with terpineol. The ink was then bead milled for 25 minutes at 5000 RPM using 0.3 mm zirconia beads. The zirconia beads were separated from the ink by filtration. A laser was used to drill a circular through hole with a diameter of 5 mm in the center of a 4 cm×4 cm 45 micrometer thick glass microfiber based substrate. The filtered ink was then printed on top of the glass microfiber based substrate using a printing pattern consisting of a 2 cm×2 cm square with a circular hole in the center with a diameter of 6 mm. The printing pattern was registered concentrically on top of the substrate such that the circular through hole and the circular printing pattern shared the same center. After printing, the deposited ink was dried at 200° C. for 5 minutes. Subsequently, the coated glass microfiber substrate was vacuum sintered at 600° C. The pressure during sintering was lower than 0.01 Pa (0.0001 mbar). The resulting porous conductive powder layer was a titanium metal porous film.

Subsequently, a $TiO_2$ based ink (or $TiO_2$-black) was printed onto the porous conductive powder layer using the same printing pattern and preparation steps as was used for the $TiH_2$.

Prior to printing the substrate may be passed through heated rubber coated rollers causing a smoothening of the surface of the substrate. The substrate may also be treated with colloidal silica before passing the substrate through rubber coated rollers.

Alternative substrates are a substrate based on aluminosilicate fibres, or a mixture of aluminosilicate fiber and glass microfiber or quartz fibers

Example 2—Porous Conductive Powder Layer Printed on a Ceramic Substrate

An ink is prepared by mixing $TiH_2$ with terpineol. The ink was then bead milled for 30 minutes at 4000 RPM using 0.3 mm zirconia beads. The zirconia beads were separated from the ink by filtration. A hole punch was used to punch a square through hole with an edge length of 5 mm in the center of a 4 cm×4 cm 67 micrometer thick aluminosilicate microfiber based substrate. The filtered ink was then printed on top of the microfiber based substrate using a printing pattern consisting of a 2 cm×2 cm square with a square hole in the center with an edge length of 6 mm. The printing pattern was registered concentrically on top of the substrate such that the square through hole and the square printing pattern shared the same center and such that the edges of the two squares were aligned.

After printing the ink was dried at 200° C. for 5 minutes. Subsequently the coated ceramic substrate was vacuum sintered at 850° C. for 30 minutes and then cooled down to around 20° C. The pressure during sintering was lower than 0.01 Pa (0.0001 mbar). The resulting porous conductive powder layer was a titanium metal porous film. Subsequently, a $TiO_2$ based ink (or $TiO_2$-black) was printed onto the porous conductive powder layer using the same printing pattern and preparation steps as was used for the $TiH_2$. The thickness of the porous conductive powder layer was 16 micro-meter and the porosity 44%. The sheet resistance measured was less than 0.5 Ohm/sq.

Alternatively, the ceramic substrate is first printed with a porous layer of $TiO_2$ to make the substrate surface smoother and more planar before printing the $TiH_2$ ink. We have found that the smoother the substrate surface before printing the $TiH_2$ ink the lower the porous conductive powder layer sheet resistance for a given porous conductive powder layer thickness.

Example 3—Second Porous Conductive Powder Layer with Platinum Deposited on Ceramic Substrate An ink is prepared by mixing $TiH_2$ with terpineol. The ink is bead milled for 25 minutes at 5000 RPM using 0.3 mm zirconia beads. The zirconia beads are separated from the ink by filtration. A laser was used to drill a circular through hole with a diameter of 5 mm in the center of a 4 cm×4 cm 45 micrometer thick glass microfiber based substrate. The filtered ink was then mixed with hexachloroplatinic acid and printed on top of the glass microfiber based substrate using a printing pattern consisting of a 2 cm×2 cm square with a circular hole in the center with a diameter of 6 mm. The printing pattern was registered concentrically on top of the substrate such that the circular through hole and the circular printing pattern shared the same center. The printed ink was then dried at 200° C. for 5 minutes. Subsequently, the printed ceramic substrate is vacuum sintered at 600° C. and then cooled down to room temperature. The pressure during sintering was lower than 0.01 Pa (0.0001 mbar). The resulting second porous conductive powder layer comprised a titanium metal porous film with catalytic amounts of platinum. Alternatively, the filtered ink is mixed with platinized conducting particles prior to printing.

Alternatively, the filtered ink is not mixed with hexachloroplatinic acid. Instead a solution of hexachloroplatinic acid is printed onto the vacuum sintered porous conductive powder layer, which is then dried and heated to decompose the deposited hexachloroplatinic acid in order to deposit platinum on the surface thus forming a second porous conductive powder layer.

The substrate may be based on aluminosilicate microfiber instead of glass microfibers, or quartz fiber and glass microfiber.

The substrate may prior to printing be passed through heated rubber coated rollers causing a smoothening of the surface of the substrate.

Example 4—Second Porous Conductive Powder Layer with Platinum Deposited on Ceramic Substrate An ink was prepared by mixing $TiH_2$ with terpineol. The ink was then bead milled for 25 minutes at 6000 RPM using 0.6 mm zirconia beads. The zirconia beads were separated from the ink by filtration. A hole punch was used to punch a square through hole with an edge length of 5 mm in the center of a 4 cm×4 cm 67 micrometer thick aluminosilicate microfiber based substrate. The filtered ink was then mixed with hexachloroplatinic acid and printed on top of the microfiber based substrate using a printing pattern consisting of a 2 cm×2 cm square with a square hole in the center with an edge length of 6 mm. The printing pattern was registered concentrically on top of the substrate such that the square through hole and the square printing pattern shared the same center and such that the edges of the two squares were aligned. The printed ink was then dried at 200° C. for 5 minutes. Subsequently, the printed substrate was heat treated in vacuum and sintered at 850° C. for 30 minutes and then cooled down to around 100° C. The pressure during sintering was lower than 0.01 Pa (0.0001 mbar). The resulting second porous conductive powder layer comprises a titanium metal porous film with catalytic amounts of platinum. The thickness of the second porous conductive powder layer was 20 micrometer and the porosity was 50%. The sheet resistance was lower than 0.6 Ohm/sq.

Alternatively, the filtered ink is not mixed with hexachloroplatinic acid. Instead a solution of hexachloroplatinic acid is printed onto the vacuum sintered porous conductive powder layer and then dried and heated to decompose the deposited hexachloroplatinic acid in order to deposit platinum on the surface of the second porous conductive powder layer. The ceramic substrate may first be printed with a porous layer of aluminosilicate to make the substrate surface smoother and more planar before printing the $TiH_2$ ink.

Example 5—Porous Conductive Powder Layers on Double Side Printed Ceramic Substrate An ink was prepared by mixing $TiH_2$ with terpineol. The ink was then bead milled for 25 minutes at 5000 RPM using 0.3 mm zirconia beads. The zirconia beads were separated from the ink by filtration and hexachloroplatinic acid and ethyl cellulose was added to the filtered ink. A laser was used to drill a circular through hole with a diameter of 5 mm in the center of a 4 cm×4 cm 45 micrometer thick glass microfiber based substrate. The ink was then printed on top of a glass microfiber based substrate using a printing pattern consisting of a 2 cm×2 cm square with a circular hole in the center with a diameter of 6 mm. The printing pattern was registered concentrically on top of the substrate such that the circular through hole and the circular printing pattern shared the same center. The printed ink was then dried at 200° C. for 5 minutes.

Another ink prepared by mixing $TiH_2$ with terpineol followed by bead milling, filtration and ethyl cellulose addition was then printed onto the opposite side of the glass microfiber substrate so that the first printed layer and the second printed layer are separated by the glass microfiber substrate. Additionally, the second printing pattern was registered concentrically on the second side of the substrate such that the circular through hole in the substrate and the circular printing pattern of the first print and the circular printing pattern of the second print shared the same center.

The double side printed substrate was then dried at 200° C. for 5 minutes. Subsequently, the double side coated ceramic substrate was vacuum sintered at 600° C. and then allowed to cool down to room temperature. The pressure during sintering was lower than 0.01 Pa (0.0001 mbar). The resulting double sided printed substrate have a porous conductive powder layer of titanium metal on one side and a second porous conductive powder layer comprising titanium metal with catalytic amounts of platinum on the other side.

Alternatively, a circular through hole can be created by perform laser drilling after the first and the second conductive layer has been printed and dried, respectively. By printing and drying continuous hole free conductive layers on each side of the substrate and then laser drilling through all three layers there is no need to use a printing pattern with holes and there is no need to register the holes in the printing pattern and therefore holes can be created by laser drilling through all three layers in one single step.

Alternatively, a circular through hole may be created by laser drilling through three layers in one single step after vacuum sintering of the printed and dried first and second conductive layer, respectively.

Alternatively, a porous ceramic coating is deposited on the opposite side of the ceramic substrate prior to laser drilling. Such a ceramic print could be useful in order to prevent electrical contact between the first and second porous conductive powder layers.

The $TiH_2$ powder may be surface treated with platinum, e.g., by thermal decomposition of a platinum salt deposited on the $TiH_2$ powder, before making an ink.

Further, the filtered ink may be mixed with hexachloroplatinic acid instead of mixing in platinized conducting particles.

Example 6—DSC Based on Porous Conductive Powder Layer Single Side Printed on Ceramic Substrate A 20 micrometer thick layer of $TiO_2$ ink containing 20 nm particles was screen printed onto the platinum free first porous conductive powder layer side of a single side printed glass microfiber substrate produced according to example 1. The thickness of the dried $TiO_2$ ink layer was 1-2 micrometer. A second 60 micrometer thick layer of $TiO_2$ ink was printed on top of the first layer of $TiO_2$ and dried. A third $TiO_2$ layer was printed on top of the second TiO2 layer and dried. Subsequently, the $TiO_2$ deposited structure was subjected to heat treatment in air at 500° C. for 20 minutes. After cooling down to around 70° C., the TiO2 deposited structure was immersed in a solution of 20 mM Z907 dye in methoxy propanol and heat treated at 70° C. for 30 minutes and subsequently rinsed in methoxy propanol and dried in dry air. The structure consisting of a glass microfiber substrate, porous conductive layer and dye-sensitized $TiO_2$ was then sandwiched together with a second structure produced according to example 3.

The second structure consisted of a glass microfiber substrate with a titanium metal porous film containing catalytic amounts of platinum. The second structure was sandwiched with the first structure such that the titanium metal porous film containing catalytic amounts of platinum was brought in physical contact with the glass microfiber substrate side of the first structure. Thereby, the conductive layers of the first and second structures were separated electrically and physically by the glass microfiber substrate in the first structure. Moreover, the circular hole in the second structure was registered concentrically, such that the through hole in the substrate in the first structure and the printing pattern hole in the first structure and the printing pattern hole in the second structure shared the same center. Thereafter, electrolyte was added to the sandwich structure and the sandwich structure was sealed.

Example 7—DSC Based on Porous Conductive Powder Layer Double Side Printed onto Ceramic Substrate A 20 micrometer thick layer of $TiO_2$ ink containing 20 nm particles was screen printed onto the platinum free first porous conductive powder layer side of a double side printed glass microfiber substrate produced according to example 5 or 6. The thickness of the dried $TiO_2$ ink layer was 1-2 micrometer. A second 60 micrometer thick layer of $TiO_2$ ink was printed on top of the first layer of $TiO_2$ and dried. A third $TiO_2$ layer was printed on top of the second $TiO_2$ layer and dried. Subsequently, the $TiO_2$ deposited structure was subjected to heat treatment in air at 500° C. for 20 minutes. After cooling down to around 70° C., the $TiO_2$ deposited structure was immersed in a solution of 20 mM Z907 dye in methoxy propanol and heat treated at 70° C. for 30 minutes and subsequently rinsed in methoxy propanol. Thereafter, electrolyte was added to the porous conductive powder layer double side printed ceramic substrate and the structure was sealed.

Example 8—DSC Based on Porous Conductive Powder Layer Double Side Printed onto Ceramic Substrate with Blocking Layer An ink was prepared by mixing $TiH_2$ with terpineol. The ink was then bead milled for 40 minutes at 5000 RPM using 0.3 mm zirconia beads. The zirconia beads were separated from the ink by filtration and hexachloroplatinic acid and ethyl cellulose was added to the filtered ink. A laser was used to drill a circular through hole with a diameter of 5 mm in the center of a 4 cm×4 cm 45 micrometer thick glass microfiber based substrate. The ink was then printed on the second surface of a glass microfiber based substrate equipped with a blocking layer of nanocellulose, which was deposited on the first surface of the substrate. The printing pattern consisted of a 2 cm×2 cm square with a circular hole in the center with a diameter of 6 mm. The printing pattern was registered concentrically on top of the substrate such that the circular through hole and the circular printing pattern shared the same center. The conducting particles in the ink were smaller than the pores of the substrate therefore the conducting particles penetrate the substrate and was printed into the substrate. The printed ink was then dried at 200° C. for 5 minutes.

Another ink prepared by mixing $TiH_2$ with terpineol followed by bead milling, filtration and ethyl cellulose addition was then printed onto the opposite side of the glass microfiber substrate so that the first printed layer and the second printed layer are separated by the glass microfiber substrate. Additionally, the second printing pattern was registered concentrically on the second side of the substrate such that the circular through hole in the substrate and the circular printing pattern of the first print and the circular printing pattern of the second print shared the same center. Additionally the second printed layer was deposited onto the nanocellulose based blocking layer.

The double side printed substrate was then dried at 200° C. for 5 minutes. Subsequently, the double side coated ceramic substrate was vacuum sintered at 600° C. and then allowed to cool down to room temperature. The pressure during sintering was lower than 0.01 Pa (0.0001 mbar). The resulting double sided printed substrate have a porous conductive powder layer of titanium metal on one side and a second porous conductive powder layer comprising titanium metal with catalytic amounts of platinum on the other side.

Subsequently, a 20 micrometer thick layer of $TiO_2$ ink containing 20 nm $TiO_2$ particles was screen printed onto the platinum free first porous conductive powder layer side of the double side printed glass microfiber substrate. The thickness of the dried $TiO_2$ ink layer was 1-2 micrometer. A second 60 micrometer thick layer of $TiO_2$ ink was printed on top of the first layer of $TiO_2$ and dried. A third $TiO_2$ layer was printed on top of the second $TiO_2$ layer and dried. Subsequently, the TiO2 deposited structure was subjected to heat treatment in air at 500° C. for 20 minutes. After cooling down to around 70° C., the $TiO_2$ deposited structure was immersed in a solution of 20 mM Z907 dye in methoxy propanol and heat treated at 70° C. for 30 minutes and subsequently rinsed in methoxy propanol. Thereafter, electrolyte was added to the porous conductive powder layer double side printed ceramic substrate and the structure was sealed.

The invention claimed is:

1. A dye-sensitized solar cell comprising:
   a porous isolating substrate (10) made of a translucent material allowing more than 50% light transmission and having a first surface and a second surface,
   a first porous layer (14) comprising at least one first non-transparent portion (25) including first conducting particles printed on and situated directly against the first surface of the porous isolating substrate to form a first conductive layer, and a plurality of first transparent portions (20) without first conducting particles, the at least one first non-transparent portion (25) and first transparent portions (20) together forming a first pattern on the first surface of the porous isolating substrate (10),
   a second porous layer (16) comprising at least one second non-transparent portion (26) including second conducting particles printed on and situated directly against the second surface of the porous isolating substrate to form a second conductive layer, and a plurality of second transparent portions (22) without second conducting particles, the at least one second non-transparent portion (26) and second transparent portions (22) forming a second pattern on the second surface of the porous isolating substrate (10),
   a third porous layer (18) comprising at least one third non-transparent portion (24) including light absorbing dye molecules deposited on and situated directly against the first porous layer (14), and a plurality of third transparent portions (21) without light absorbing dye molecules, with the at least one third non-transparent portion (24) and third transparent portions (21) forming a third pattern on the first porous layer (14),
   said first (20), second (22), and third (21) transparent portions allowing more than 50% light transmission,
   a charge transfer medium for transferring charges between the third and second porous layers (18,16),
   a first connection element (34) electrically connected to a lateral side of the first porous layer (14) for connecting the first porous layer (14) to an external electric circuit, and
   a second connection element (36) electrically connected to a lateral side of the second porous layer (16) for connecting the second porous layer to the external electric circuit, wherein
   said first (20), second (22), and third (21) transparent portions are positioned relative to each other to form continuous transparent pathways through the first, second, and third porous layers (14, 16, 18) and the porous isolating substrate (10) of the solar cell, the continuous transparent pathways being in a direction perpendicular to the first surface and the second surface of the porous isolating substrate (10),
   the porous isolating substrate (10) is positioned directly between the first transparent portions (20) and the second transparent portions (22) in the direction perpendicular to the first surface and the second surface of the porous isolating substrate (10), and
   the at least one first non-transparent portion (25) is in direct electrical contact with the first connection element (34) and the at least one second non-transparent portion (26) is in direct electrical contact with the second connection element (36).

2. The dye-sensitized solar cell according to claim 1, wherein the first (20), second (22), and third (21) transparent portions are arranged to at least partly overlap each other.

3. The dye-sensitized solar cell according to claim 1, wherein an area of the first (20), second (22), and third (21) transparent portions of each said first, second and third porous layer (14,16,18) is between 10% and 70% of a total area of each said first, second and third porous layer (14, 16, 18).

4. The dye-sensitized solar cell according to claim 3, wherein the area of the first (20), second (22), and third (21) transparent portions of each said first, second and third porous layer (14, 16, 18) is between 30% and 60% of the total area of each said first, second and third porous layer (14, 16, 18).

5. The dye-sensitized solar cell according to claim 1, wherein said at least one first, second, and third non-transparent portions (25, 26, 24) of the first, second and third porous layers (14, 16, 18) extend across the porous isolating substrate (10) from end to end.

6. The dye-sensitized solar cell according to claim 1, wherein the porous isolating substrate (10) comprises glass fibers or quartz fibers or plastic.

7. The dye-sensitized solar cell according to claim 1, wherein the first, second and third transparent portions (20, 22, 21) are in the form of holes or dots.

8. The dye-sensitized solar cell according to claim 1, wherein the third pattern of the third porous layer (18) has the same shape and orientation as the first pattern of the first porous layer (14), and the second pattern of the second porous layer (16) has the same shape and orientation as the first and third patterns of the first and third porous layers (14, 18).

* * * * *